(12) United States Patent
Jang (10) Patent No.: US 7,884,419 B2
(45) Date of Patent: Feb. 8, 2011

(54) SEMICONDUCTOR DEVICE AND METHOD OF FABRICATING THE SAME

(75) Inventor: Byung Tak Jang, Seongnam-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 576 days.

(21) Appl. No.: 12/002,096

(22) Filed: Dec. 14, 2007

(65) Prior Publication Data

US 2009/0095999 A1  Apr. 16, 2009

(30) Foreign Application Priority Data

Dec. 27, 2006 (KR) .................. 10-2006-0135702

(51) Int. Cl.
*H01L 29/76* (2006.01)

(52) U.S. Cl. ............ 257/329; 438/270; 257/E21.41; 257/E29.262; 257/E29.257

(58) Field of Classification Search .......... 438/259, 438/270–272; 257/329–331, 336, E21.41, 257/E29.262, E29.257

See application file for complete search history.

(56) References Cited

U.S. PATENT DOCUMENTS

| 6,037,202 A | * | 3/2000 | Witek ............... 438/212 |
| 6,949,432 B2 | * | 9/2005 | Blanchard ............ 438/259 |
| 6,998,678 B2 | * | 2/2006 | Werner et al. .......... 257/334 |
| 7,812,409 B2 | * | 10/2010 | Hshieh .............. 257/401 |

* cited by examiner

*Primary Examiner*—David Vu
(74) *Attorney, Agent, or Firm*—The Law Offices of Andrew D. Fortney; Andrew D. Fortney (57) ABSTRACT

Provided are a semiconductor device and a method of fabricating the semiconductor device. The semiconductor device includes a first conductive well region in a semiconductor substrate and a second conductive well region on or in the first conductive well region. A gate electrode is in a trench on a gate insulation layer, and the trench is in the second conductive region and the first conductive well region. A drain includes a drain insulation layer, a (polysilicon) shield layer, and drain plug. The drain insulation layer is in a trench in the second conductive region and the first conductive well region. The shield layer encloses the drain plug. A lower portion of the drain plug contacts the second conductive well region. A first conductive source region is at a side of the gate electrode.

8 Claims, 10 Drawing Sheets

SEMICONDUCTOR DEVICE AND METHOD OF FABRICATING THE SAME

CROSS-REFERENCE TO RELATED APPLICATIONS

The present application claims priority under 35 U.S.C. 119 and 35 U.S.C. 365 to Korean Patent Application No. 10-2006-0135702 (filed on Dec. 27, 2006), which is hereby incorporated by reference in its entirety.

BACKGROUND

Embodiments of the invention relate to a semiconductor device and a method of fabricating the semiconductor device.

Trench metal oxide semiconductor (MOS) transistors differ from MOS transistors in that channels of the trench MOS transistors are formed in a vertical direction. Channels of more conventional MOS transistors are formed in a horizontal direction. The trench MOS transistor includes a vertical channel and a drain formed in a backside of a wafer as an output region.

As compared with more conventional MOS transistors, the trench MOS transistors are suitable for high-current and high-voltage operations using a small area. To apply a high voltage to the trench MOS transistor, it is necessary to form a lightly doped drain region (a drift region) in a sufficiently large length.

Since electrons move vertically in a trench MOS transistor, a lightly doped drain region can be vertically formed to increase a withstand voltage without increasing the area of a chip by adjusting a vertical doping profile. Therefore, high withstand-voltage and high-current operation can be possible using a small area. However, the structure of a trench MOS transistor may be changed to form the trench MOS transistor on a chip as a CMOS transistor.

SUMMARY

Embodiments of the invention provide a trench metal oxide semiconductor (MOS) transistor.

Embodiments also provide a trench MOS transistor that can be formed at a low cost on the same chip as a complementary metal oxide semiconductor (CMOS) transistor.

In one embodiment, a semiconductor device (e.g., a trench MOS transistor) includes: a first conductive well region in a semiconductor substrate; a second conductive well region on (or in) the first conductive well region; a gate electrode in a first trench on a gate insulation layer (also in the first trench), the trench being in the second conductive region and (at least part of) the first conductive well region; a drain including a drain insulation layer, a (polysilicon) shield layer, and a drain plug, the drain insulation layer being in a second trench in the second conductive region and (at least part of) the first conductive well region, the polysilicon layer enclosing the drain plug, a lower portion of the drain plug being in contact with the second conductive well region; and a first conductive source region at a side of the gate electrode.

In another embodiment, there is provided a method of fabricating a semiconductor device (e.g., a trench MOS transistor), the method including: forming first and second conductive well regions in a semiconductor substrate, the second conductive well region being formed on or in the first conductive well region; removing portions of the second conductive region and the first conductive well region to form first and second trenches; forming a gate oxide layer in the first trench and a drain insulation layer in the second trench; forming a polysilicon layer in the trenches, wherein the polysilicon layer fills the first trench and covers sidewalls of the second trench; implanting first conductive dopant ions into the polysilicon layer on the gate insulation layer so as to form a gate electrode; removing a portion of the drain insulation layer and forming a drain plug by filling the second trench a conductive material (e.g., polysilicon heavily doped with first conductive dopant ions); and forming a first conductive source region at a side of the gate electrode.

The details of one or more embodiments are set forth in the accompanying drawings and the description below. Other features will be apparent from the description and drawings, and from the claims.

DETAINED DESCRIPTION OF THE EMBODIMENTS

A semiconductor device and a method of fabricating the semiconductor device will now be described with reference to the accompanying drawings according to embodiments.

Figure 1:
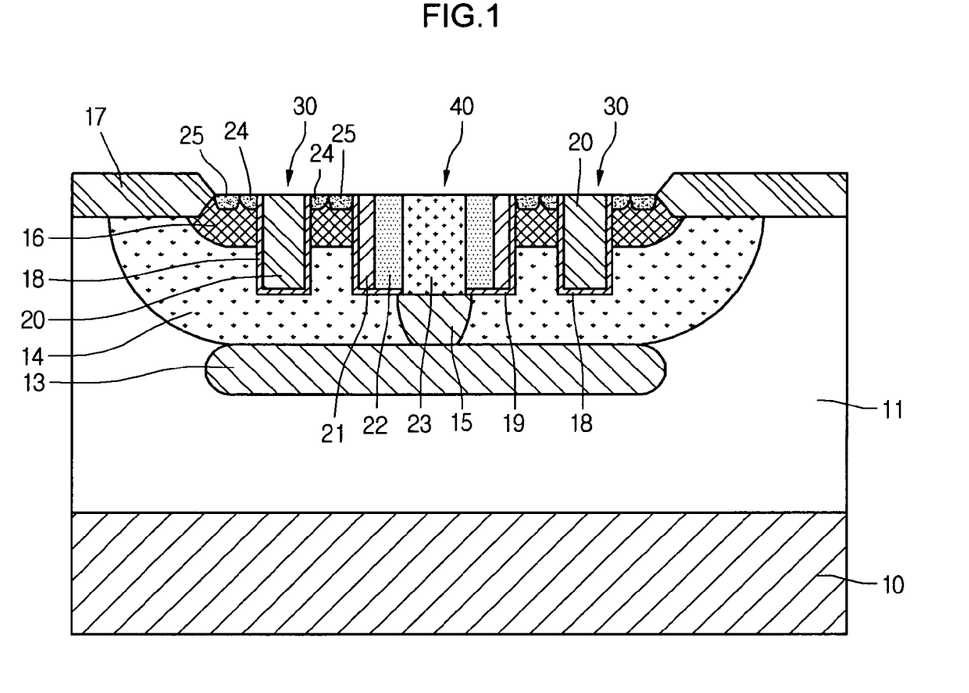
FIG. 1 is a view illustrating a semiconductor device according to an exemplary embodiment.

FIG. 1 is a view illustrating a semiconductor device according to an embodiment.

Referring to FIG. 1, an N-type buried layer (NBL) 13 is formed in a P-type epitaxial layer 11 on a semiconductor substrate 10. The epitaxial layer 11 may comprise or consist essentially of epitaxially grown silicon and/or silicon-germanium. A device isolation layer 17 is formed in the semiconductor substrate 10 to divide the semiconductor substrate 10 into regions. The device isolation layer 17 may comprise a filed oxide layer formed by local oxidation of silicon (LOCOS) or shallow trench isolation (STI). A horizontal complementary metal oxide semiconductor (CMOS) transistor can be formed in another region isolated by the device isolation layer 17.

A deep N well 14 is formed on the NBL 13 in the P-epi layer 11, and a shallow P well 16 is formed in or on the deep N well 14 in the P-epi layer 11.

Figure 10:
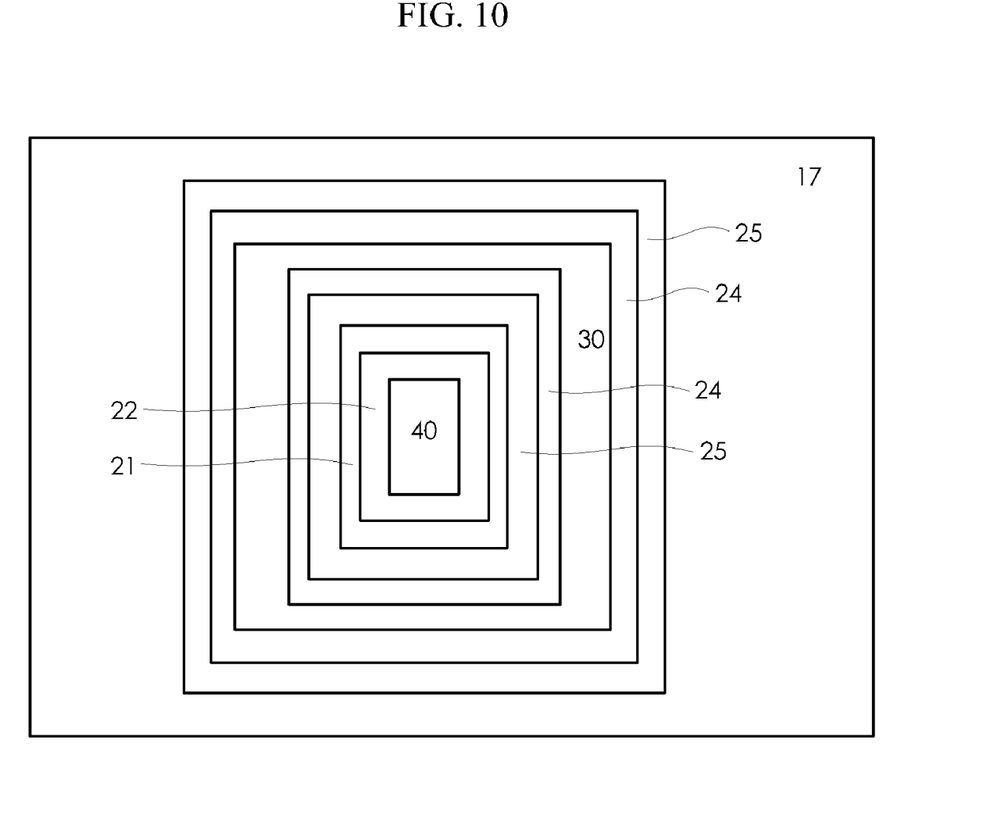
FIG. 10 shows an exemplary layout view of the exemplary embodiment of the semiconductor device according to FIG. 1.

Trenches are formed in the semiconductor substrate 10 for forming one or more gates 30 and a drain 40 in the semiconductor substrate 10. In the exemplary embodiment shown in FIG. 1, a single drain 40 is formed between two gates 30. However, the gate structures 30 can also form a unitary ring around the drain 40, as shown in the exemplary layout view in FIG. 10.

Gate electrode(s) 20 are formed on gate insulation layer(s) 18. An oxide layer is formed in the trenches to form the gate insulation layer(s) 18 and drain insulation layer 19, and a conductor such as non-doped polysilicon is deposited in the trenches by chemical vapor deposition (CVD). The conductor may comprise another material, such as tungsten, tungsten silicide, aluminum, copper, etc., which may have one or more adhesive and/or barrier liner layers (e.g., Ti, TiN, Ta TaN, bilayers such as TiN on Ti or TaN on Ta, etc.) between the conductor and the oxide 18 and/or insulator 19. Then, when the gate electrode 20, N type dopant ions (e.g., P, As or Sb) are implanted into the non-doped polysilicon, and the polysilicon is heat treated (e.g., by annealing) to form the gate electrode(s) 20.

The drain 40 is formed as follows. An oxide layer is formed in the trench as a drain insulation layer 19 (generally at the same time as gate oxide 18), and a non-doped polysilicon layer 21 and a silicon oxide 22 are sequentially formed. Like the case of the gate electrode(s) 20, non-doped polysilicon or another conductor is deposited in the trench by CVD (optionally at the same time as gate 20) to form a drain plug 23. When the drain plug 23 comprises polysilicon, N type dopant ions are implanted into the (non-doped) polysilicon (optionally at the same time as gate 20, when polysilicon is in the trench). Thereafter, the polysilicon is heat treated (e.g., by annealing, optionally at the same time as polysilicon gate[s] 20) to form a drain polysilicon layer 23.

P+ doped body regions 25 and N+ doped source regions 24 are formed in a surface of the semiconductor substrate 10 (e.g., the exposed or uppermost surface of shallow P-well 16).

A deep N region 15 is formed in N-well 14 prior to formation of the drain plug 23 to facilitate movement of electrons from the source regions 24 to the drain plug 23.

In the exemplary semiconductor device, the drain 40 is formed in a center portion, and the gates 30 are formed at sides of the drain 40. Since only one drain 40 is formed in the semiconductor device, the size of the semiconductor device can be reduced.

Since electrons move vertically in the exemplary semiconductor device, a low-concentration drain region can be vertically formed to increase a withstand voltage without increasing the size of the semiconductor device by adjusting a vertical doping profile. Therefore, high withstand-voltage and high-current operation can be possible using a small area.

FIGS. 2 to 9 are views for explaining a method of fabricating a semiconductor device according to various embodiments.

Figure 2:
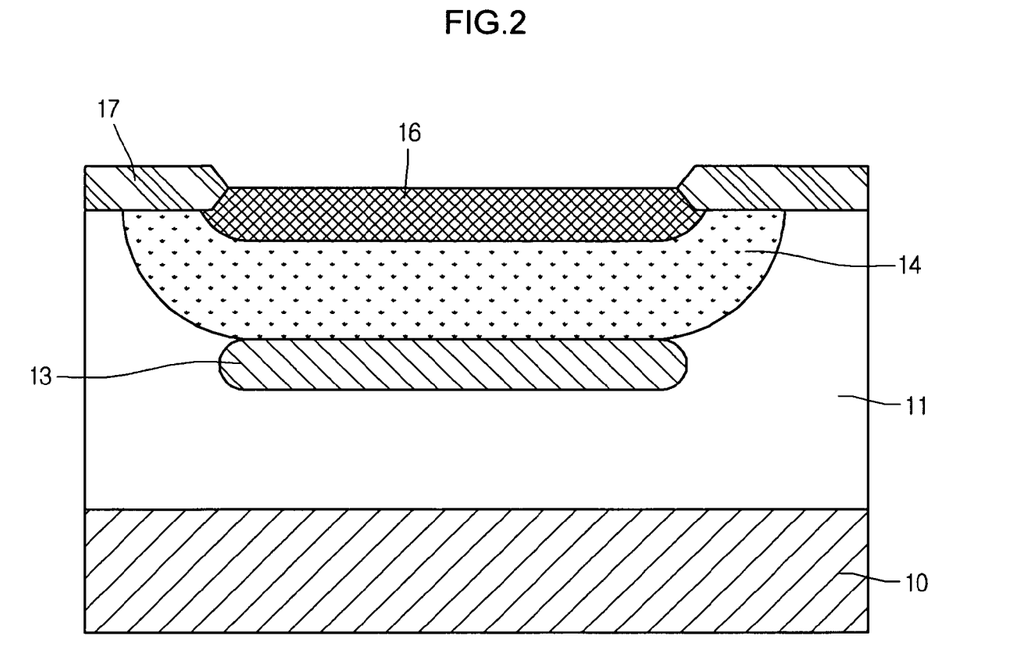
FIGS. 2 to 9 are views for explaining a method of fabricating a semiconductor device according to embodiments of the invention.

Referring to FIG. 2, an NBL 13 is formed by implanting N type dopant ions into a P-epi layer 11 of a semiconductor substrate 10. Next, a deep N well 14 is formed on the NBL 13 by implanting N type dopant ions into the P-epi layer 11, and a shallow P well 16 is formed in the deep N well 14 by implanting P type dopant ions (e.g., B) into the P-epi layer 11. In one embodiment, each successive implant has a higher dose or concentration of dopant than the preceding implant. For example, the deep N well 14 may have a higher dose or concentration of dopant than the NBL 13, and the shallow P well 16 may have a higher dose or concentration of dopant than the deep N well 14.

Then, a device isolation layer 17 is formed on the semiconductor substrate 10 to isolate the exemplary semiconductor device (e.g., a vertical MOS transistor) from a region of the semiconductor substrate 10 in which a horizontal CMOS transistor is formed.

Figure 3:
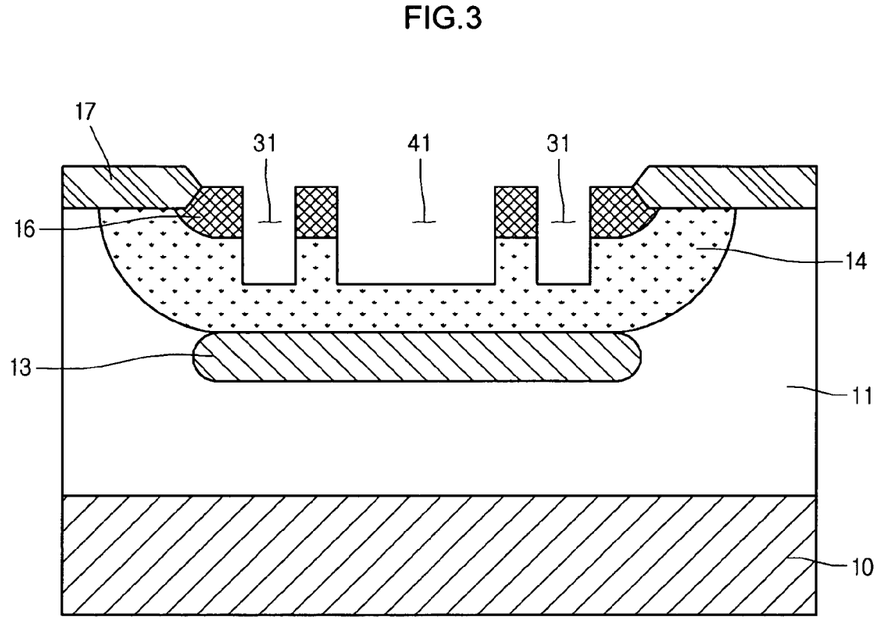

Referring to FIG. 3, portions of the semiconductor substrate 10 are selectively removed (e.g., by photolithographic masking and subsequent etching) to form trenches (side and central trenches 31 and 41). The side trench(es) 31 are used for forming gates, and the central trench 41 is used for forming a drain. The central trench 41 may have a width, for example, of from 3 to 5 times the width of a side trench 31.

Figure 4:
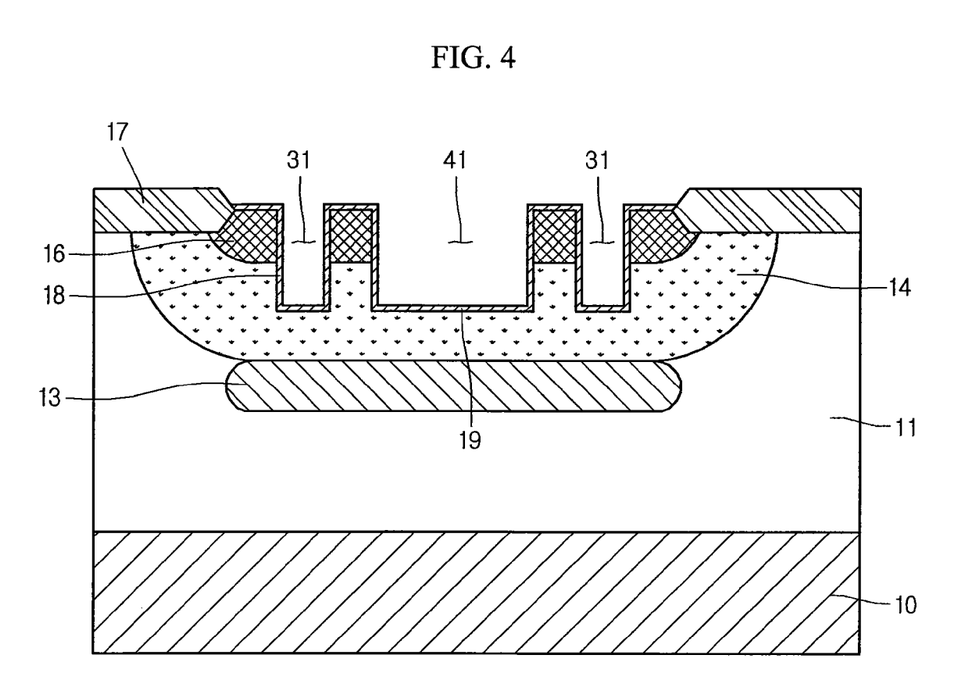

Referring to FIG. 4, an oxide layer is formed in the trenches 31 and 41 to form gate insulation layers 18 and a drain insulation layer 19. The oxide layer may be a thermal oxide layer (e.g., grown by wet or dry thermal oxidation) or a CVD oxide (e.g., deposited by chemical vapor deposition from silicon and oxygen precursors, such as silane gas or tetraethyl orthosilicate, and oxygen and/or ozone, respectively).

Figure 5:
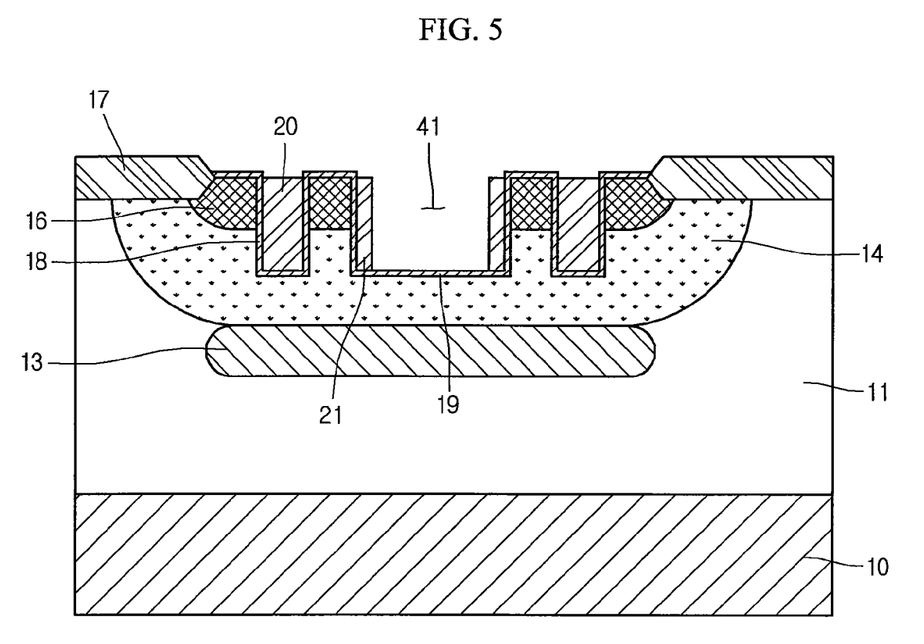

Referring to FIG. 5, non-doped polysilicon (or another conductor, such as tungsten, aluminum, titanium nitride, etc.) is formed (e.g., by conformal deposition) on the entire surface of the semiconductor substrate 10 by CVD, and the conductor is selectively removed by anisotropic etching (e.g., reactive ion etching). As a result, the remaining conductor (e.g., non-doped polysilicon) fills the side trench(es) 31 and covers sidewalls of the central trench 41.

Then, when the conductor is non-doped polysilicon, one or more gate electrodes 20 are formed by implanting N type dopant ions into the non-doped polysilicon in the side trenches 31, then heat-treating (e.g., annealing) the polysilicon to drive in the dopant.

Figure 6:
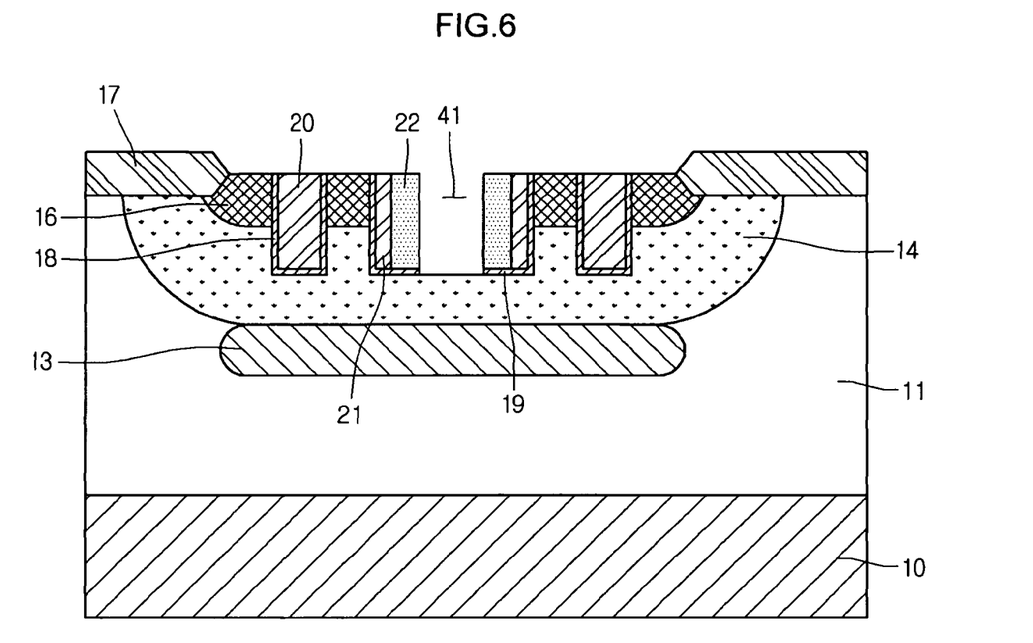

Referring to FIG. 6, a silicon oxide 22 is formed on the entire surface of the semiconductor substrate 10 (e.g., by CVD or other conformal deposition process) and is selectively removed by anisotropic etching (e.g., reactive ion etching). As a result, the silicon oxide 22 remains only in the trench 41, and the exposed thermal oxide 18/19 on the horizontal surfaces of the deep well 14 and shallow well 16 may be removed. For example, during the etching, a bottom portion of the drain insulation layer 19 is removed from the trench 41.

The silicon oxide 22 reduces parasitic capacitance between a drain plug 23 (refer to FIG. 8) and body regions 25 (refer to FIG. 8), and increases an insulation voltage.

Figure 7:
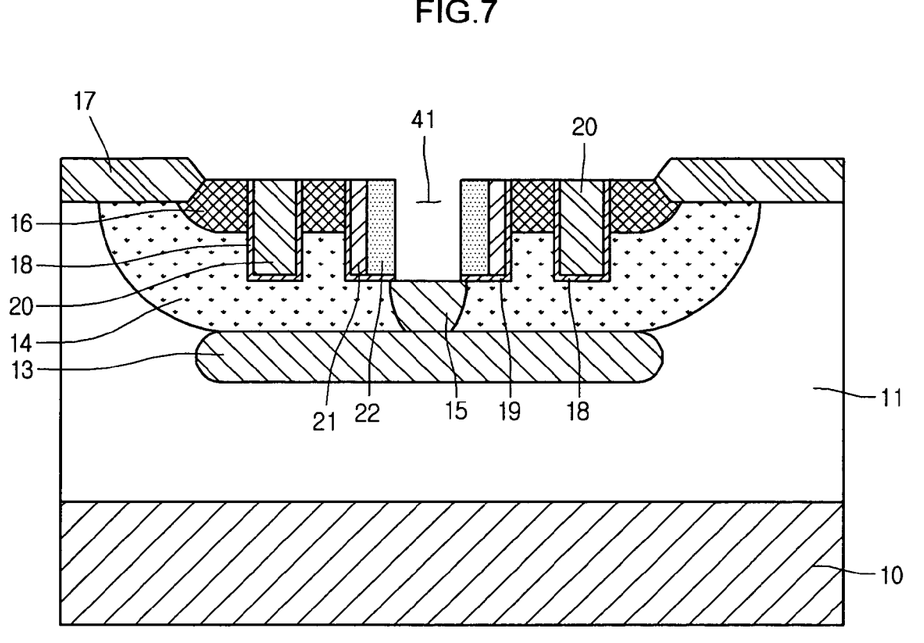

Referring to FIG. 7, N type dopant ions are implanted into the semiconductor substrate 10 (and in particular, deep P-well 16) through the trench 41 and the removed bottom portion of the drain insulation layer 19 so as to form a deep N region 15.

Figure 8:
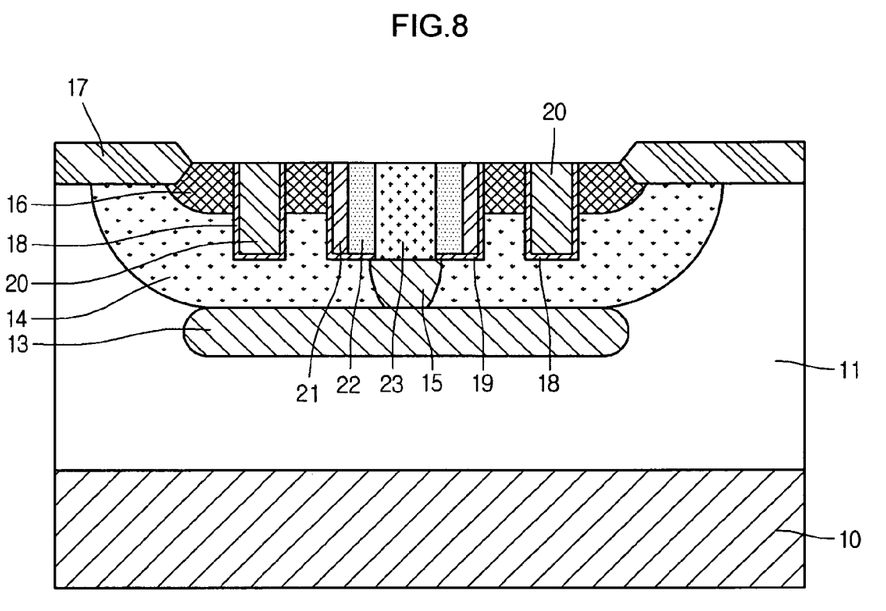

Referring to FIG. 8, a conductive material such as a high-concentration N type polysilicon, tungsten, tungsten silicide, aluminum, etc., is deposited into the trench 41 by CVD or sputtering so as to form the drain plug 23. The excess deposited material for the drain plug 23 can be removed by planarization (e.g., blanket dry and/or plasma etching [e.g., etch-back], mechanical polishing, or chemical mechanical polishing [CMP]).

Figure 9:
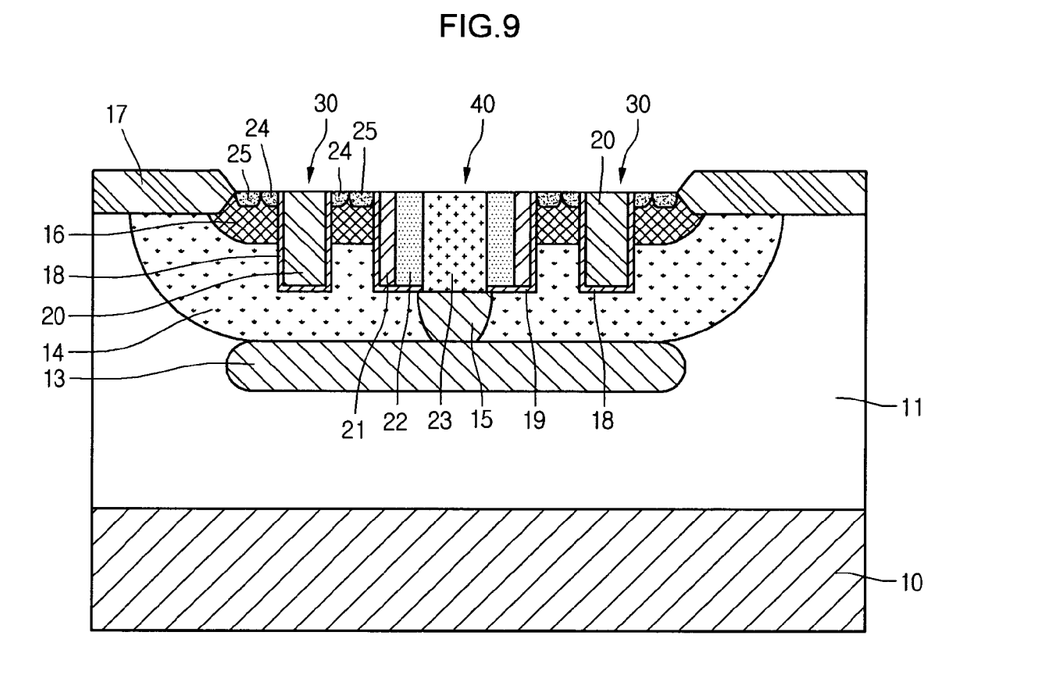

Referring to FIG. 9, following appropriate photolithographic masking of areas not to be implanted (not shown), P type dopant ions are implanted into the semiconductor substrate 10 to form the body regions 25 in surface portions of the semiconductor substrate 10, and (following subsequent removal of the body region mask and photolithographic masking of further areas not to be implanted) N type dopant ions are implanted into the semiconductor substrate 10 to form source regions 24 in surface portions of the semiconductor substrate 10.

In the exemplary embodiment(s), the processes of forming the NBL 13 and the deep N region 15 can be performed together with processes of forming wells in a CMOS transistor. In addition, after the side and central trenches 31 and 41 are formed, the remaining processes of forming the semiconductor device can be performed together with the processes of forming the CMOS transistor (e.g., CMOS transistor gate oxide can be grown at the same time as the vertical transistor gate oxide 18, gate polysilicon can be deposited at the same time as gate or drain conductor 20 or 23, CMOS transistor source/drain regions can be implanted at the same time as source regions 24 and body regions 25, etc.). Therefore, most of the processes of forming the exemplary semiconductor device (e.g., vertical CMOS transistor) can be performed together with the processes of forming the CMOS transistor(s). Therefore, a trench MOS transistor can be formed with fewer additional processes.

In another embodiment, the complementary vertical CMOS transistor can be made by switching the ion impurity types in the various implantation regions to the complementary type (e.g., NBL 13 can be T-type instead of N-type, well 14 can be a P-well, shallow well 16 can be an N-well, etc.).

According to the semiconductor device and the method of fabricating the semiconductor device, a trench MOS transistor can be formed in the same chip as a CMOS transistor at low costs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a first conductive well region in a semiconductor substrate;
   a second conductive well region on the first conductive well region;
   a gate electrode in a first trench on a gate insulation layer in the first trench, the first trench being in the second conductive region and at least part of the first conductive well region;
   a drain including a conductive shield layer, a drain insulation layer, and a drain plug, the drain insulation layer being in a second trench in the second conductive region and at least part of the first conductive well region, the conductive shield layer enclosing the drain plug, and the drain plug being in contact with the second conductive well region; and
   a first conductive source region at a side of the gate electrode.

2. The semiconductor device according to claim 1, wherein the drain further includes a silicon oxide layer between the drain plug and the conductive shield layer.

3. The semiconductor device according to claim 1, further comprising a first conductive high-concentration impurity region between the drain plug and the first conductive well region.

4. The semiconductor device according to claim 1, wherein the drain insulation layer is on a side and a bottom of the conductive shield layer.

5. The semiconductor device according to claim 1, wherein the drain insulation layer comprises an oxide layer.

6. The semiconductor device according to claim 1, further comprising a first conductive buried layer under the first conductive well region.

7. The semiconductor device according to claim 1, wherein the first conductive source region is at opposite sides of the gate electrode.

8. The semiconductor device according to claim 1, further comprising a second conductive body region at a side of the first conductive source region.

\* \* \* \* \*